US012727140B2

(12) United States Patent
Chen et al.

(10) Patent No.: US 12,727,140 B2
(45) Date of Patent: Sep. 1, 2026

(54) LAYOUT PATTERN OF STATIC RANDOM-ACCESS MEMORY

(71) Applicant: UNITED MICROELECTRONICS CORP., Hsin-Chu City (TW)

(72) Inventors: Po-Lin Chen, Tainan City (TW); Tsung-Hsun Wu, Kaohsiung City (TW); Liang-Wei Chiu, Tainan City (TW); Yao-Chin Cheng, Hsinchu City (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 457 days.

(21) Appl. No.: 18/367,471

(22) Filed: Sep. 13, 2023

(65) Prior Publication Data

US 2025/0056781 A1 Feb. 13, 2025

(30) Foreign Application Priority Data

Aug. 10, 2023 (TW) ................................ 112130100

(51) Int. Cl.
*H10B 10/00* (2023.01)

(52) U.S. Cl.
CPC .................................. *H10B 10/12* (2023.02)

(58) Field of Classification Search
CPC ........ H10B 10/12; H10B 10/18; H10D 89/10; G11C 11/41
See application file for complete search history.

(56) References Cited

U.S. PATENT DOCUMENTS

| | | | | |
|---|---|---|---|---|
| 6,177,708 | B1 | 1/2001 | Kuang | |
| 6,537,861 | B1 | 3/2003 | Kroell | |
| 6,750,555 | B2 * | 6/2004 | Satomi | H10B 10/12 257/E27.098 |
| 6,815,282 | B2 | 11/2004 | Dachtera | |
| 7,271,454 | B2 | 9/2007 | Hirano | |
| 8,299,519 | B2 | 10/2012 | Chou | |
| 8,809,187 | B2 | 8/2014 | Tan | |
| 9,991,268 | B1 * | 6/2018 | Liaw | H10B 10/12 |
| 10,043,571 | B1 * | 8/2018 | Liaw | H10B 10/12 |
| 10,153,287 | B1 * | 12/2018 | Wang | H10B 10/12 |
| 10,157,662 | B1 * | 12/2018 | Wu | H10B 10/12 |

(Continued)

FOREIGN PATENT DOCUMENTS

| | | |
|---|---|---|
| CN | 106328188 | 1/2017 |
| CN | 109545251 | 3/2019 |
| CN | 109904159 | 6/2019 |

*Primary Examiner* — Ida M Soward
(74) *Attorney, Agent, or Firm* — Winston Hsu

(57) ABSTRACT

A layout pattern of static random-access memory (SRAM) includes a substrate, a plurality of diffusion regions and a plurality of gate structures are located on the substrate, each diffusion region includes a first diffusion region, a second diffusion region, a third diffusion region, a fourth diffusion region, a fifth diffusion region, a sixth diffusion region, a seventh diffusion region and an eighth diffusion region, and each gate structure spans the plurality of diffusion regions. The plurality of gate structures include a first gate structure, the first gate structure includes a first L-shaped portion, which spans the first diffusion region and the fifth diffusion region and forms a first pull-down transistor (PD1), the first diffusion region is adjacent to and in direct contact with the fifth diffusion region.

20 Claims, 11 Drawing Sheets

(56) References Cited

U.S. PATENT DOCUMENTS 10,411,022 B1* 9/2019 Hsieh ..................... H10B 10/12
10,460,794 B1* 10/2019 Liaw ...................... H10B 10/12
10,535,667 B1* 1/2020 Liaw ...................... H10B 10/12
11,205,474 B1* 12/2021 Yang ...................... H10B 10/12
11,404,425 B2* 8/2022 Chou ..................... G11C 29/12
11,475,953 B1* 10/2022 Tseng ..................... G11C 15/04
2003/0063490 A1* 4/2003 Violette .............. H10W 10/012
257/E21.552
2015/0348850 A1* 12/2015 Lee ........................... G03F 1/00
438/587
2017/0018302 A1* 1/2017 Yin ....................... H01L 23/528
2017/0323894 A1 11/2017 Yeh

* cited by examiner

LAYOUT PATTERN OF STATIC RANDOM-ACCESS MEMORY

BACKGROUND OF THE INVENTION

1. Field of the Invention

The invention relates to a static random access memory (SRAM), in particular to a static random access memory (SRAM) layout pattern with body contact.

2. Description of the Prior Art

An embedded static random access memory (SRAM) comprises a logic circuit and a static random access memory connected to the logic circuit. SRAM is a kind of volatile memory cell, which means it preserves data only while power is continuously applied. SRAM is built of cross-coupled inverters that store data during the time that power remains applied, unlike dynamic random access memory (DRAM) that needs to be periodically refreshed. Because of its high access speed, SRAM is also used in computer systems as a cache memory.

SUMMARY OF THE INVENTION

A layout pattern of static random-access memory (SRAM) includes a substrate, and a plurality of diffusion regions are located on the substrate, each diffusion region including a first diffusion region, a second diffusion region, a third diffusion region, a fourth diffusion region, a fifth diffusion region, a sixth diffusion region, a seventh diffusion region and an eighth diffusion region. Each diffusion region is arranged along a first direction (Y direction), and a plurality of gate structures are located on the substrate, and each gate structure extends along a second direction (X direction) and spans the diffusion regions to form a plurality of transistors. The plurality of transistors comprise a first pull-up transistor (PU1), a first pull-down transistor (PD1), a second pull-up transistor (PU2), a second pull-down transistor (PD2), a first access transistor (PG1) and a second access transistor (PG2), the plurality of gate structures include a first gate structure, wherein the first gate structure includes a first L-shaped portion, which spans the first diffusion region and the fifth diffusion region and forms a first pull-down transistor (PD1), wherein the first diffusion region is adjacent to and directly contacts the fifth diffusion region.

The invention is characterized in that an improved layout pattern of static random access memory is proposed, in which some additional diffusion regions are located next to the original diffusion regions, the additional diffusion regions have the opposite conductivity type to the original diffusion regions, and the gate structures are designed to be L-shaped or T-shaped (from the top view). In this way, the charges accumulated under the gate structure can flow out through the diffusion region, and then the charges is released through the contact structure, so as to avoid affecting the electrical properties of the transistor and improve the product yield.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
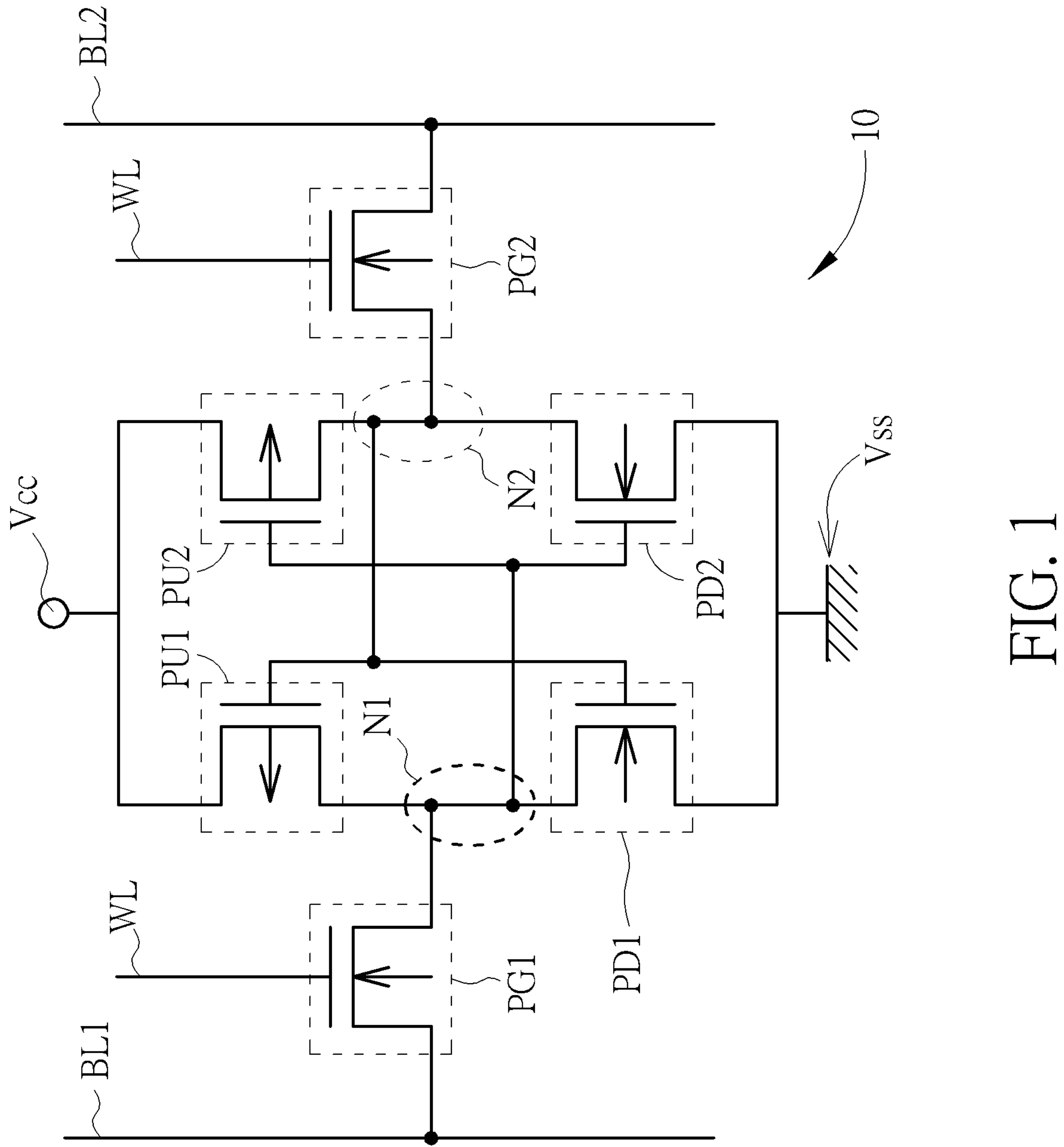
FIG. 1 shows a circuit diagram of an SRAM cell.

The invention provides a layout pattern of an embedded static random access memory (embedded SRAM). Please refer to FIG. 1, which shows a circuit diagram of an SRAM cell of the present invention. In this embodiment, a SRAM cell 10 is composed of a first pull-up device PU1, a second pull-up device PU2, and a first pull-down device PD1, a second pull-down device PD2, a first access transistor PG1 and a second access transistor PG2. These six devices (transistors) constitute a set of flip-flops. The first and the second pull-up devices PU1 and PU2, and the first and the second pull-down devices PD1 and PD2 constitute a latch circuit that stores data in the storage nodes N1 and N2. Since the first and the second pull-up devices PU1 and PU2 act as power load devices, they can be replaced by resistors. Under this circumstance, the static random access memory becomes a four-transistor SRAM (4T-SRAM). In this embodiment, the first and the second pull-up devices PU1 and PU2 preferably share a source/drain region and electrically connect to a voltage source (voltage node) Vcc, and the first and the second pull-down devices PD1 and PD2 share a source/drain region and electrically connect to a voltage source (voltage node) Vss.

In one embodiment, the first and the second pull-up devices PU1 and PU2 of the SRAM cell 10 are composed of P-type metal oxide semiconductor (PMOS) transistors; the first and the second pull-down devices PD1 and PD2, the first access transistor PG1 and the second access transistor PG2 composed of N-type metal oxide semiconductor (NMOS) transistors, but not limited thereto. The first pull-up device PU1 and the first pull-down device PD1 constitute an inverter, which further form a series circuit. One end of the series circuit is connected to a voltage source Vcc and the other end of the series circuit is connected to a voltage source Vss. Similarly, the second pull-up device PU2 and the second pull-down device PD2 constitute another inverter and a series circuit. One end of the series circuit is connected to the voltage source Vcc and the other end of the series circuit is connected to the voltage source Vss. The two inverters are cross-coupled to each other to storage data.

Besides, the storage node N1 is connected to the respective gate structures of the second pull-down device PD2 and the second pull-up device PU2. The storage node N1 is also connected to the drains of the first pull-down device PD1, the first pull-up device PU1 and the first access transistor PG1. Similarly, the storage node N2 is connected to the respective gate structures of the first pull-down device PD1 and first the pull-up device PU1. The storage node N2 is also connected to the drains of the second pull-down device PD2, the second pull-up device PU2 and the second access transistor PG2. The gate structures of the first access transistor PG1 and the second access transistor PG2 are respectively coupled to a word line (WL); the source of the first access transistor PG1 and the second access transistor PG2 are respectively coupled to a first bit line (BL1) and a second bit line (BL2).

The SRAM cell 10 includes six transistors, so it can be called a six-transistors static random access memory (6T-SRAM). However, the SRAM cell of the present invention is not limited to 6T-SRAM, and other SRAM patterns with more transistors, such as 8T-SRAM and 10T-SRAM, can also be used as the SRAM cell of the present invention. In addition, each of the above transistors can also include other combinations of P-type transistors and N-type transistors.

FIGURE is a layout diagram of static random access memory (SRAM) cells in a preferred embodiment of the present invention. In this embodiment, the SRAM cell 10 is located in a region R and is disposed on a substrate 12, such as a silicon substrate or an SOI substrate. The substrate 12 is provided with a plurality of diffusion regions D arranged in parallel with each other, and shallow trench isolation (not shown) is arranged around each diffusion region D.

In addition, the substrate 12 includes a plurality of gate structures G, and each of the above-mentioned transistors (including the first pull-up transistor PU1, the second pull-up transistor PU2, the first pull-down transistor PD1, the second pull-down transistor PD2, the first access transistor PG1, and the second access transistor PG2) includes a gate structure G across at least one diffusion region D, and constitutes each transistor.

Figure 2:
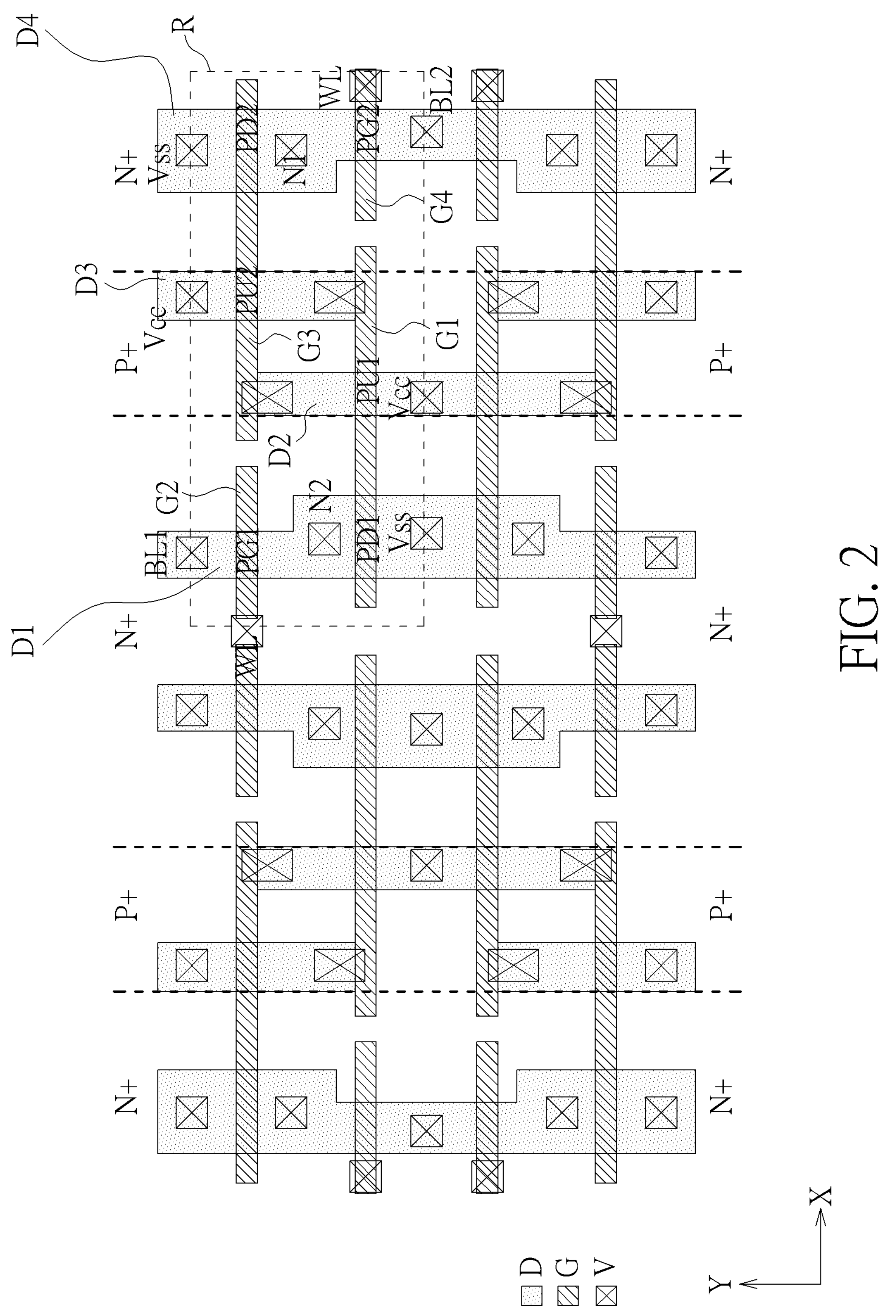
FIG. 2 is a layout of a static random access memory (SRAM) cell.

As shown in FIG. 2, in order to clearly define the positions of each gate structure G and diffusion region D, the gate structures G are defined as the gate structure G1, the gate structure G2, the gate structure G3 and the gate structure G4, and the diffusion regions D are also defined as the diffusion region D1, the diffusion region D2, the diffusion region D3 and the diffusion region D4. The gate structure G1 spans the diffusion region D2 to form a pull-up transistor PU1. The gate structure G1 spans the diffusion region D1 to form a pull-down transistor PD1. The gate structure G2 spans the diffusion region D1 to form an access transistor PG1. The gate structure G3 spans the diffusion region D3 to form a pull-up transistor PU2. The gate structure G3 spans the diffusion region D4 to form a pull-down transistor PD2. The gate structure G4 spans the diffusion region D4 to form the access transistor PG2. It can be understood that the gate structure G1, the gate structure G2, the gate structure G3 and the gate structure G4 all belong to the gate structures G, and the diffusion regions D1, D2, D3 and D4 all belong to the diffusion regions D.

In the present invention, the diffusion regions D1, D2, D3 and D4 are preferably arranged along a first direction (for example, the Y-axis direction), while the gate structures G1, G2, G3 and G4 are strip-shaped structures, all of which are arranged along a second direction (for example, the X-axis direction). Preferably, the first direction and the second direction are perpendicular to each other.

In the region R, there are also a plurality of metal layers (not shown) and contact vias V. The metal layers and contact vias V are mainly used to electrically connect transistors with other elements, such as word lines, bit lines, voltage sources, or to connect storage nodes as interconnection structures of transistors. The material of the metal layer and the contact via V is, for example, metal, and they may have the same material. For the sake of simplicity, the position of the metal layer is not drawn in FIG. 2, but for the sake of clearer explanation, the transistors, storage nodes, word lines, bit lines, voltage sources, etc. connected to each element are marked in FIG. 2 to clearly show the connection relationship of each element.

In addition, in the embodiment of FIG. 2, since the first pull-down transistor PD1, the second pull-down transistor PD2, the first access transistor PG1 and the second access transistor PG2 are composed of N-type MOS transistors, the diffusion region D they span is also an N-type doped diffusion region. On the contrary, since the first pull-up transistor PU1 and the second pull-up transistor PU2 are composed of P-type MOS transistors, the diffusion region D they span is also a P-type doped diffusion region. That is, as shown in FIG. 2, the diffusion regions D1 and D4 are N-type diffusion regions, while the diffusion regions D2 and D3 are P-type diffusion regions. In FIG. 2. "N+" indicates the N-type doped region and "P+" indicates the P-type doped region.

Figure 3:
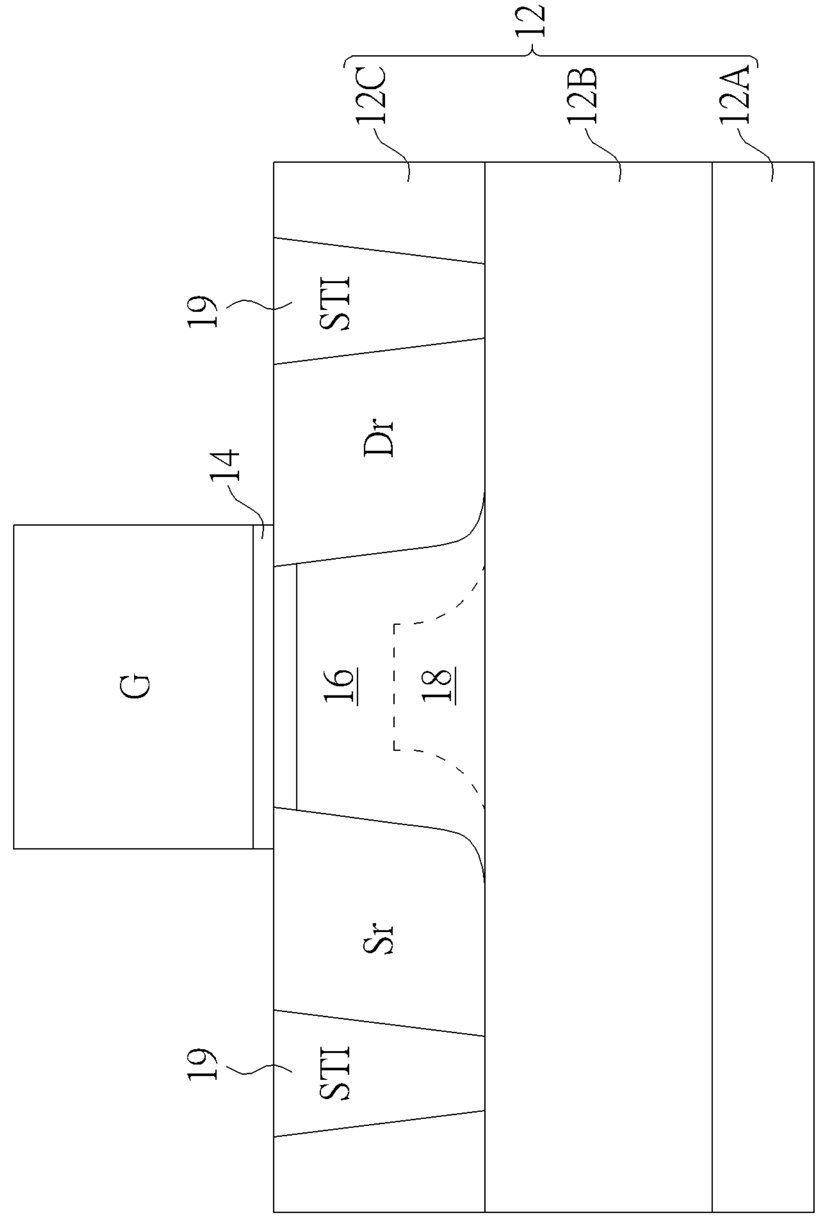
FIG. 3 shows a schematic cross-sectional structure of a transistor.

The applicant found that when a transistor is formed on a silicon-on-insulator (SOI) substrate, some charges may accumulate under the gate structure and be confined, resulting in electrical instability. In more detail, FIG. 3 shows a schematic cross-sectional structure of a transistor. As shown in FIG. 3, the substrate 12 is an SOI substrate, which includes a silicon layer 12A, an insulating layer 12B and a silicon layer 12C stacked from bottom to top. The gate structure G is located on the substrate 12, and a gate structure dielectric layer 14 is included between the gate structure G and the substrate 12. The substrates on both sides of the gate structure respectively include a source Sr and a drain Dr, and shallow trench isolation (STI) 19 is located outside the source Sr and the drain Dr. A depletion region 16 is included below the gate structure G and between the source Sr and the drain Dr. However, there is a region 18 under the depletion region 16 between the depletion region 16 and the insulating layer 12B, and some charges may accumulate in the region 18, but these charges cannot be discharged from the region 18, and the charges accumulated in the region 18 may affect the electrical properties of the transistor.

In order to solve the above problems, the present invention provides several improved layout patterns of static random access memory. By adding some of diffusion regions and changing the shape of the gate structure, the accumulated charges under the gate structure can be released, so that the problem of the above-mentioned charges accumulation under the gate structure can be avoided. Please refer to the following paragraphs for more details.

Figure 4:
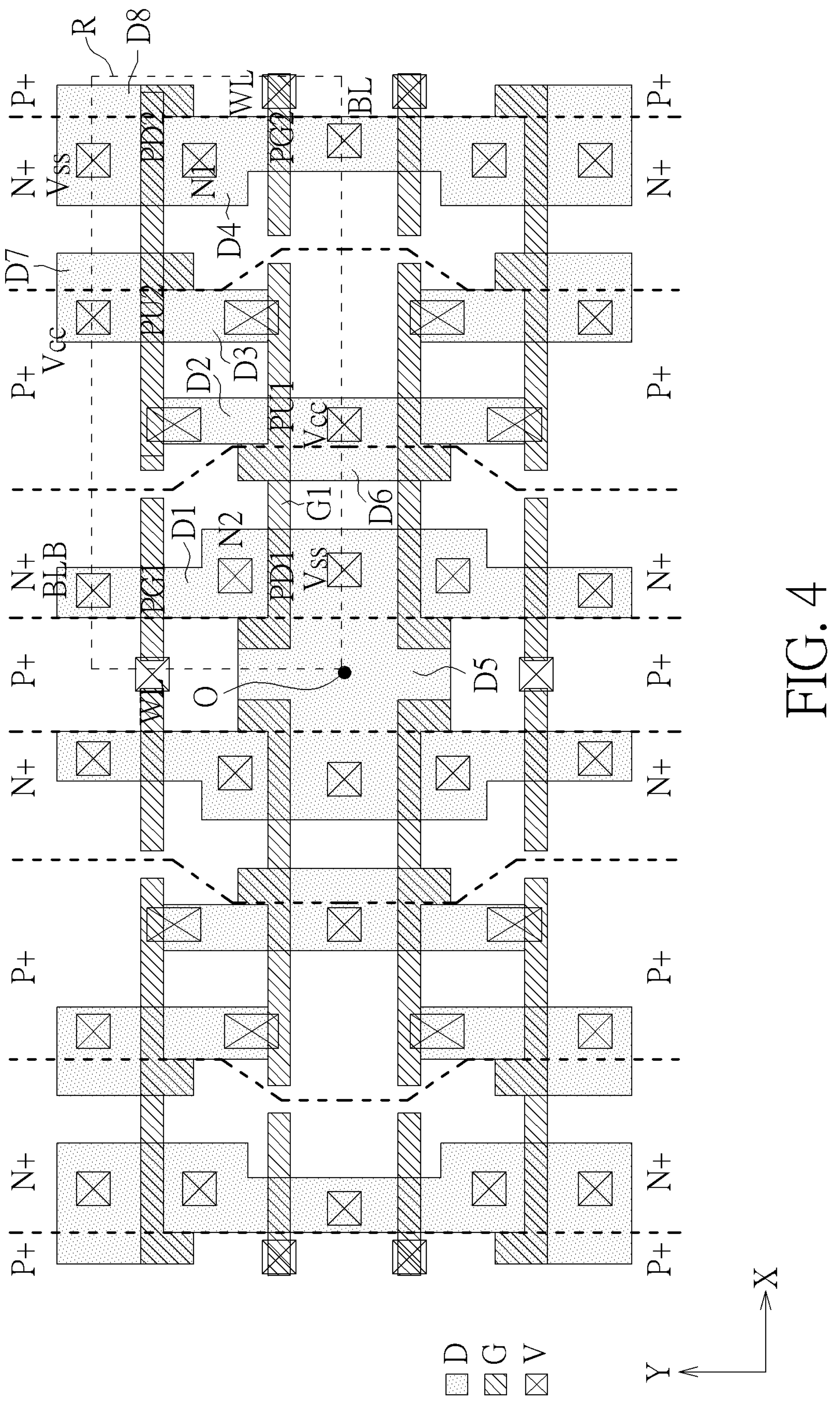
FIG. 4 is a layout diagram of a static random access memory (SRAM) cell according to a first preferred embodiment of the present invention.
Figure 5:
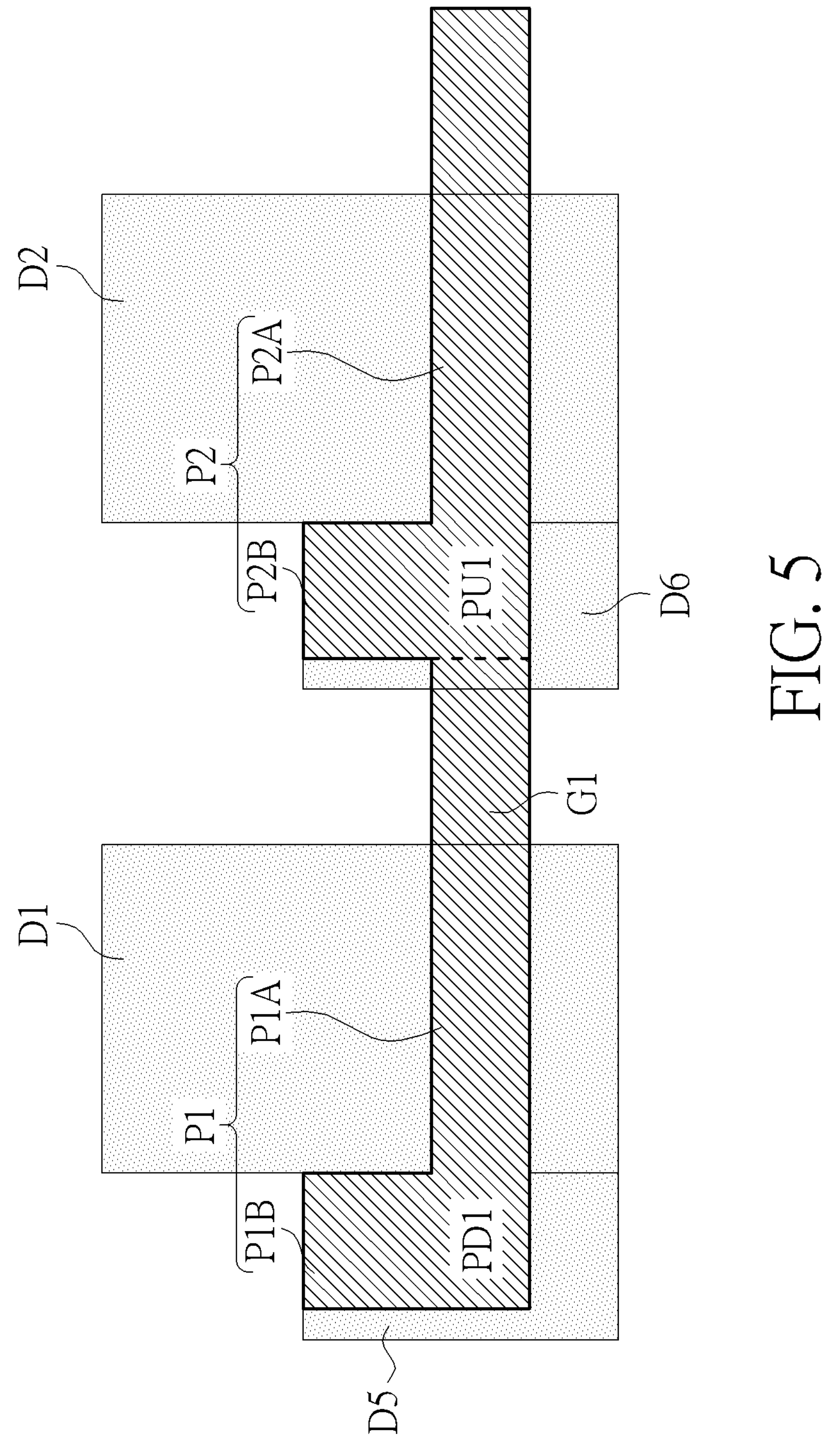
FIG. 5 shows an enlarged schematic view of the gate structure G1 and its vicinity in FIG. 4.

FIG. 4 is a layout diagram of a static random access memory (SRAM) cell according to a first preferred embodiment of the present invention. As shown in FIG. 4, compared with the embodiment shown in FIG. 2, this embodiment includes additional diffusion regions D5, D6, D7 and D8 in addition to the above diffusion regions D1 to D4. The diffusion region D5 is connected with the diffusion region D1, the diffusion region D6 is connected with the diffusion region D2, the diffusion region D7 is connected with the diffusion region D3, and the diffusion region D8 is connected with the diffusion region D4. In addition, the shapes of the gate structure G1 and the gate structure G3 are also different from the embodiment shown in FIG. 2. More specifically, FIG. 5 shows an enlarged schematic diagram of the gate structure G1 and its vicinity in FIG. 4. Please note that FIG. 5 mainly depicts the positional relationship between the gate structure G1 and the diffusion region, and omits elements such as the contact via V. As shown in FIG. 5, taking the gate structure G1 as an example, the gate structure G1 includes a first L-shaped portion P1 constituting the pull-down transistor PD1 and a second L-shaped portion P2 constituting the pull-up transistor PU1, and the first L-shaped portion P1 includes a long side portion P1A and a short side portion P1B, and the second L-shaped portion P2 also includes a long side portion P2A and a short side portion P2B. From the top view, the first L-shaped portion P1 and the second L-shaped portion P2 are L-shaped, respectively. The long side portion P1A of the first L-shaped portion P1 is located on the diffusion region D1, and the short side portion P1B is located on the diffusion region D5. The long side portion P2A of the second L-shaped portion P2 is located on the diffusion region D2, and the short side portion P2B is located on the diffusion region D6.

In this embodiment, the added diffusion regions D5-D8 are located next to the diffusion regions D1-D4 respectively, and the electrical properties of the diffusion regions D5-D8 are opposite to those of the adjacent diffusion regions D1-D4. For example, the diffusion region D1 is N-type, and the diffusion region D5 adjacent to the diffusion region D1 is P-type. By analogy, in this embodiment, the diffusion regions D5 and D8 are P-type, while the diffusion regions D6 and D7 are N-type.

Taking the first pull-down transistor PD1 as an example, since the diffusion region D2 crossed by the gate structure of the first pull-down transistor PD1 is N-type, the source Sr and the drain Dr of the first pull-down transistor D1 are N-type, therefore, P-type charges will accumulate in the region directly below the gate structure and be confined by the N-type source Sr and the drain Dr, which will be confined directly below the gate structure in the embodiment shown in FIG. 2 and cannot be discharged. However, through the improved design of the present invention, as shown in FIG. 4, the P-type charges directly below the gate structure of the first pull-down transistor PD1 can flow out through the diffusion region D5 which is also P-type, and then be connected to the Vss contact structure through the metal silicide layer (not shown) formed on the surfaces of the diffusion regions D1-D8, so that the charges can be released. Similarly, the charges (the N-type charges) accumulated directly under the gate structure of the first pull-up transistor PU1 will also flow out through the N-type diffusion region D6, and then be connected to the Vcc contact structure through the metal silicide layer (not shown), so that the charges can be released. As for the second pull-up transistor PU2 and the second pull-down transistor PD2, the accumulated charges can flow out from the diffusion region D7 and the diffusion region D8, respectively. Because the second pull-up transistor PU2 and the second pull-down transistor are the symmetrical patterns of the first pull-up transistor PU1 and the first pull-down transistor PD1 along the center point O, they are not repeated here. Therefore, the Vss contact structure and the Vcc contact structure described here can be used as body contact between the pull-down transistors (PD1, PD2) and the pull-up transistors (PU1, PU2) respectively, and their functions are to release the accumulated charges in the substrate.

In the layout design of FIG. 4, the accumulated charges of the first pull-up transistor PU1, the first pull-down transistor PD1, the second pull-up transistor PU2 and the second pull-down transistor PD2 can be discharged. In the applicant's practical experience, the charges accumulation of the pull-down transistors PD1 and PD2 is more serious than that of the pull-up transistors PU1 and PU2, so in other embodiments of the present invention, layout design can also be made only for releasing the accumulated charges of the first pull-down transistor PD1 and the second pull-down transistor PD2.

Figure 6:
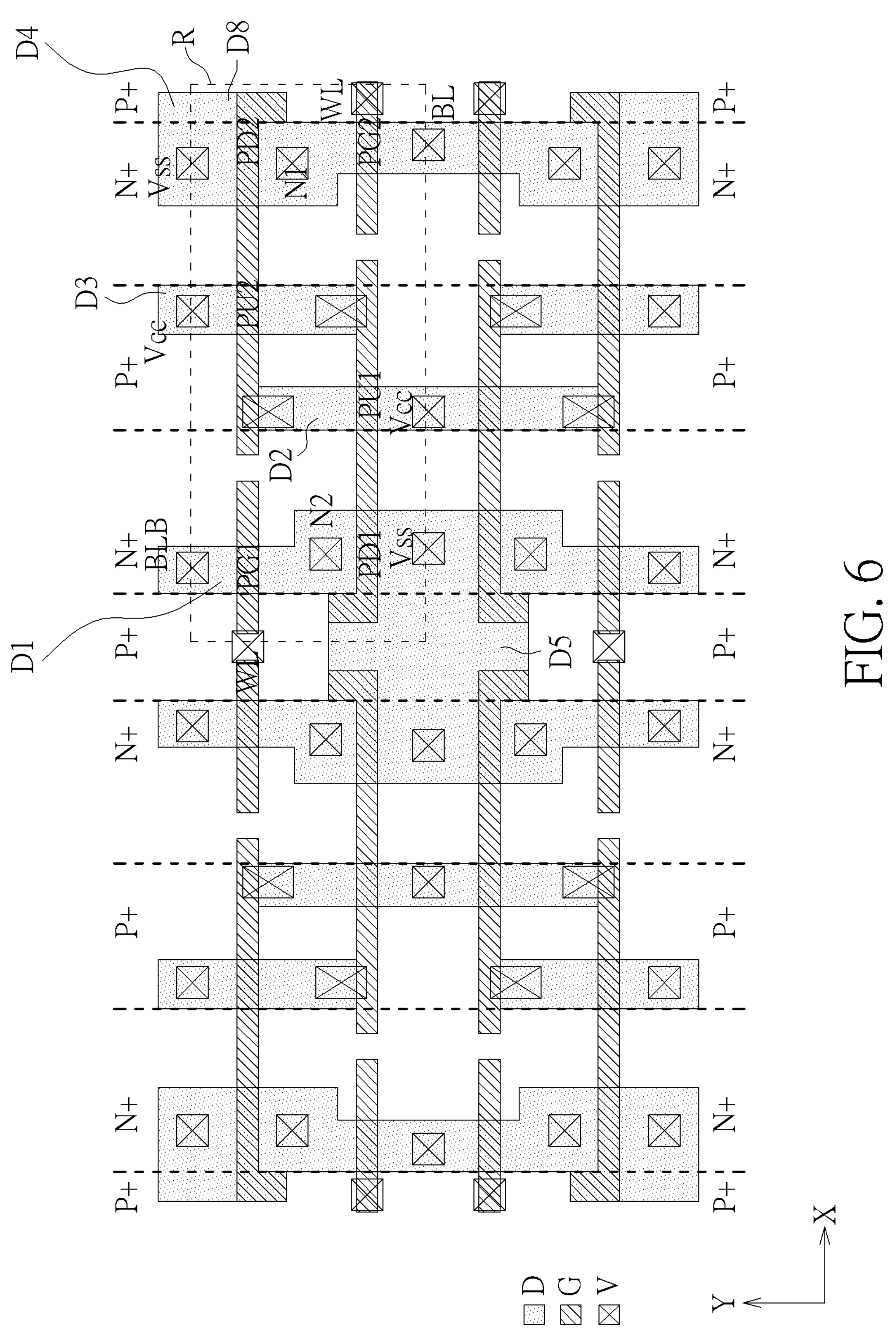
FIG. 6 is a layout diagram of a static random access memory (SRAM) cell according to a second preferred embodiment of the present invention.

FIG. 6 is a layout diagram of a static random access memory (SRAM) cell according to a second preferred embodiment of the present invention. In this embodiment, most of the structures are the same as the embodiment shown in FIG. 4 above, and the same parts are not repeated here. However, this embodiment is different from the above embodiment in that it does not include the diffusion regions D6 and D7, and the second L-shaped portion P2 of the gate structure G1 and the gate structure G3 is not designed as L-shaped. Therefore, in this embodiment, only the accumulated charges of the first pull-down transistor PD1 and the second pull-down transistor PD2 will be released. However, compared with the above embodiments, the invention has the advantages of simple structure, easy manufacture, small occupied area and the like.

Figure 7:
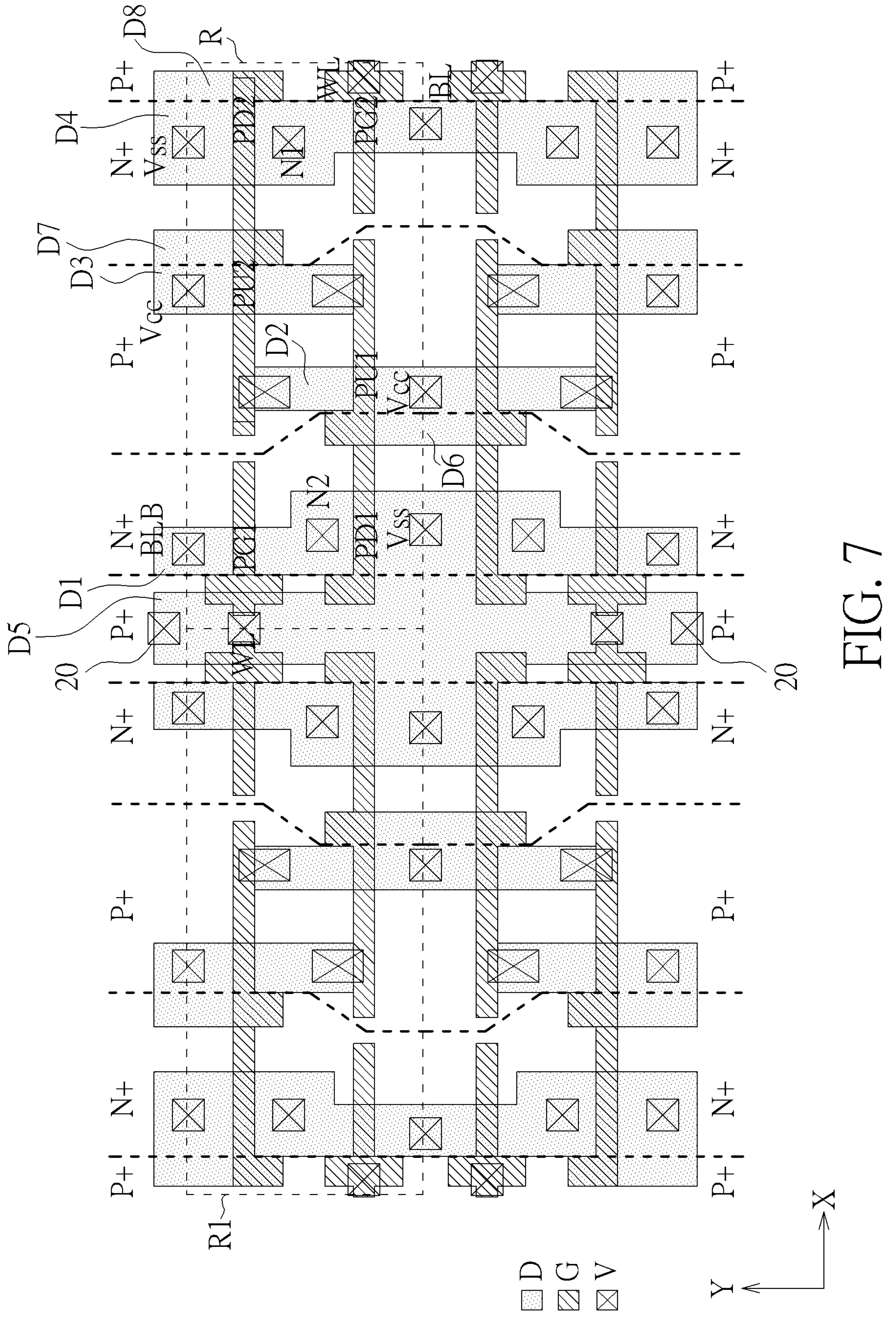
FIG. 7 is a layout diagram of a static random access memory (SRAM) cell according to a third preferred embodiment of the present invention.
Figure 8:
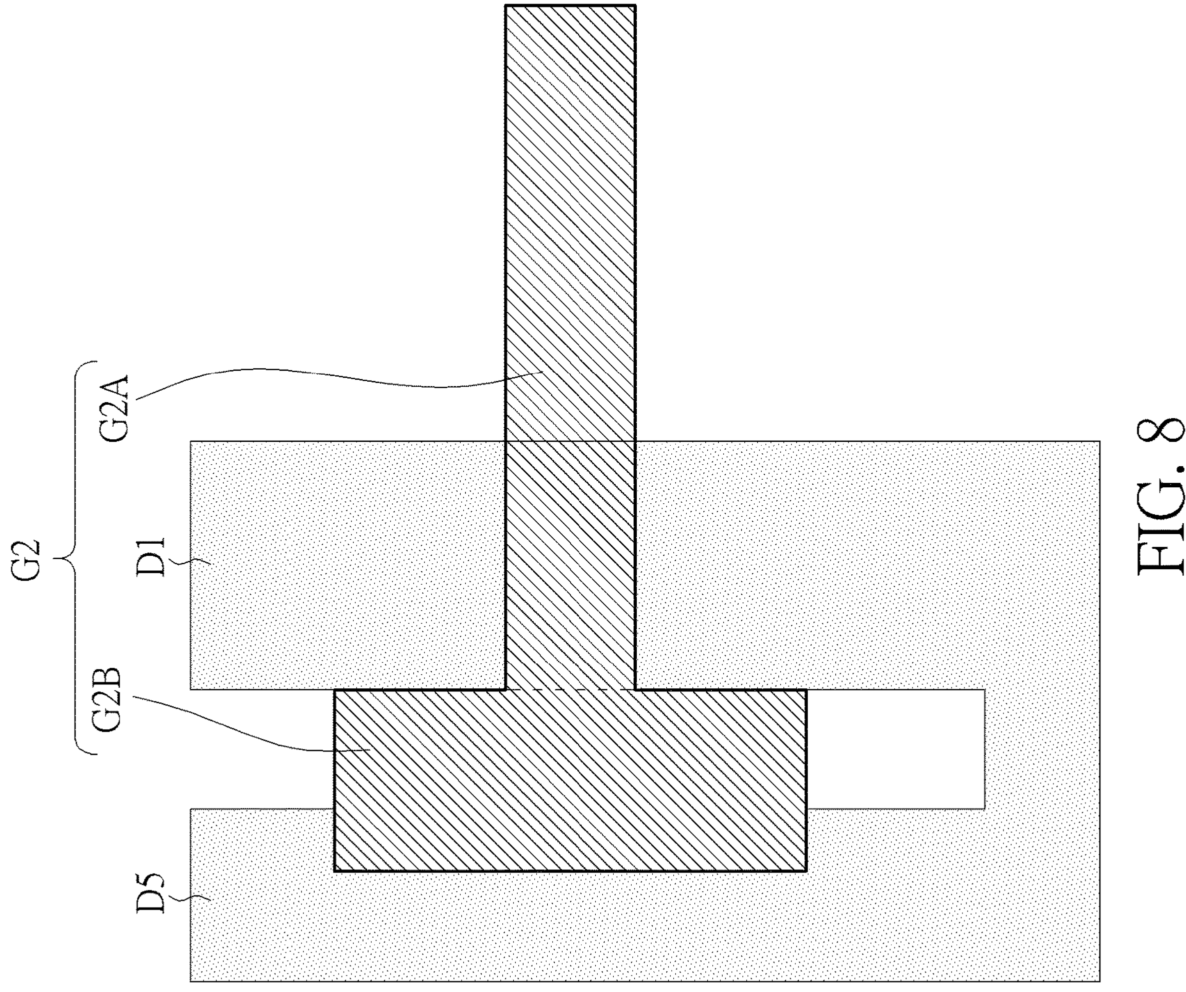
FIG. 8 shows an enlarged schematic view of the gate structure G2 and its vicinity in FIG. 7.

FIG. 7 is a layout diagram of a static random access memory (SRAM) cell according to a third preferred embodiment of the present invention. In this embodiment, most of the structures are the same as the embodiment shown in FIG. 4 above, and the same parts are not repeated here. This embodiment is different from the above embodiment in that the gate structure G2 and the gate structure G4 are designed in a T-shape from the top view. In more detail, FIG. 8 shows an enlarged schematic diagram of the gate structure G2 and its vicinity in FIG. 7. Please note that FIG. 8 mainly depicts the positional relationship between the gate structure G2 and the diffusion region, and omits elements such as contact vias V. As shown in FIG. 8, taking the gate structure G2 as an example, when viewed form the top view, the gate structure G2 is T-shaped and has a long side portion G2A and a short side portion G2B. The long side portion G2A extends along the X-axis direction and is located on the diffusion region D1, and the short side portion G2B extends along the Y-axis direction and is located on the diffusion region D5. In this way, the accumulated charges directly under the gate structures of the first access transistor PG1 and the second access transistor PG2 can also be released.

In the same way as the above-mentioned method for releasing the accumulated charges of the first pull-down transistor PD1, through the design of this embodiment, the accumulated charges (the P-type charges) directly under the gate structures of the first access transistor PG1 and the second access transistor PG2 can flow out from the diffusion region D5 and the diffusion region D8 respectively, and in this embodiment, the body contact 20 is also formed on the diffusion region D5 and the diffusion region D8, which is similar to the contact via V and is electrically connected to the diffusion region D5. Therefore, the accumulated charges of the first access transistor PG1 and the second access transistor PG2 can be discharged through the body contact 20.

Each SRAM cell 10 described in this embodiment can be arranged in an array. The adjacent SRAM cells 10 may share a part of the diffusion region. For example, there is a SRAM cell in the region R shown in FIG. 6, and there is another SRAM cell in another adjacent region R1 to the left of the region R, where the diffusion region D5 of the SRAM cell in the region R is actually equal to the diffusion region D8 of the SRAM cell in the region R1.

Other embodiments of the present invention are provided below, and the layout patterns of these embodiments are improved based on the above-mentioned embodiments, in which most elements may be the same as those described in the above-mentioned embodiments, and these elements are denoted by the same reference numerals and will not be repeated.

Figure 9:
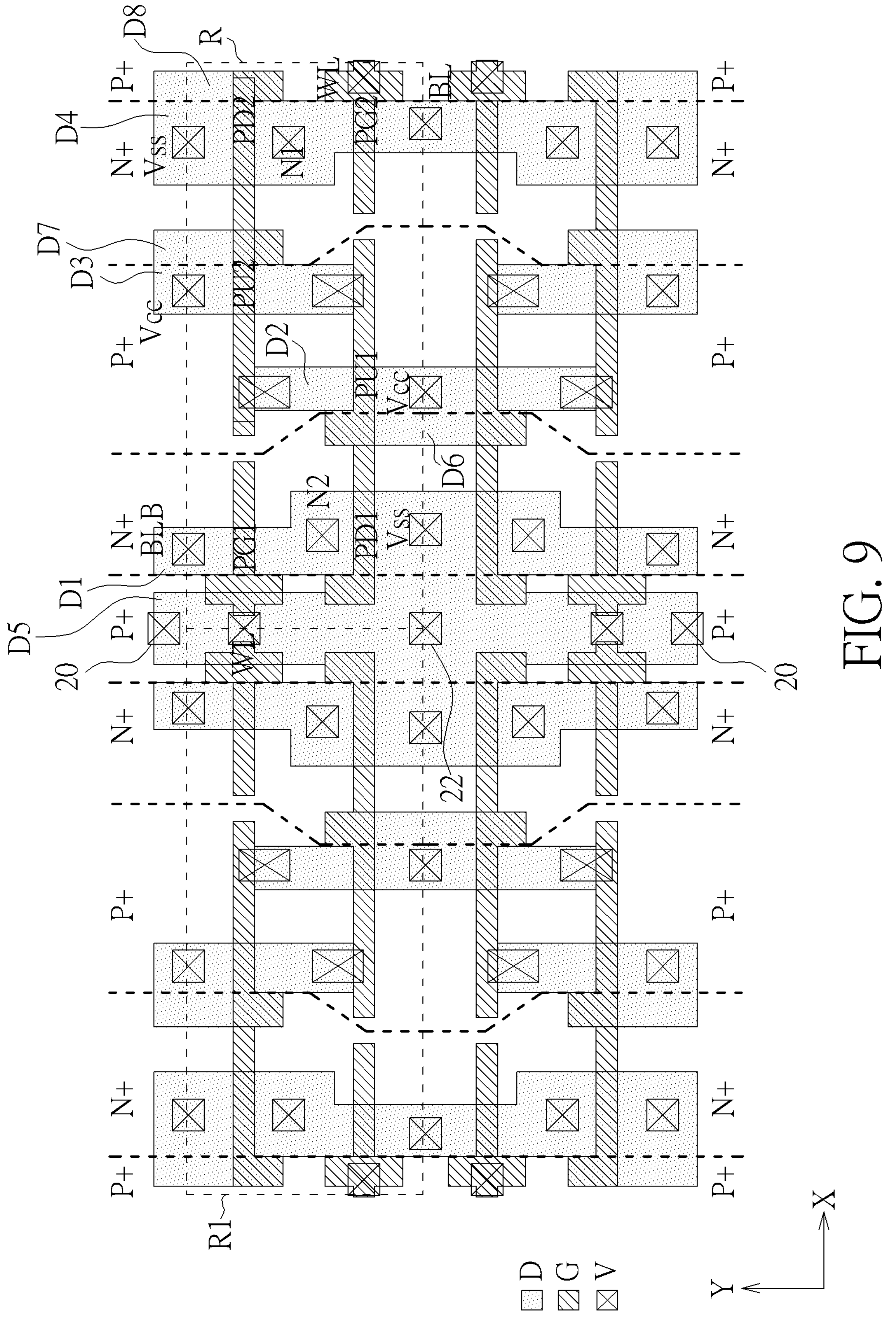
FIG. 9 is a layout diagram of a static random access memory (SRAM) cell according to a fourth preferred embodiment of the present invention.

FIG. 9 is a layout diagram of a static random access memory (SRAM) cell according to a fourth preferred embodiment of the present invention. Most of the elements in this embodiment are the same as those in the third embodiment shown in FIG. 7, but the difference between this embodiment and the third embodiment is that there is a body contact 22 in the diffusion region D5, which is similar to the contact via V, electrically connected to the diffusion region D5 and located beside the first pull-down transistor PD1, so the accumulated charges of the pull-down transistor (PD1 or PD2) can be discharged through the body contact 22. In the above embodiment, the charges of the pull-down transistor (PD1 or PD2) is released by connecting the metal silicide subsequently formed on the surface of the diffusion region through the Vss contact structure, but the conductivity of the metal silicide may be poor due to the lack of manufacturing process. Therefore, in this embodiment, a body contact 22 can be added. This structure allows the access transistor (PG1 and PG2) and the pull-down transistor (PD1 or PD2) to include the body contact 20 and the body contact 22 respectively, which can release the charges more effectively.

Figure 10:
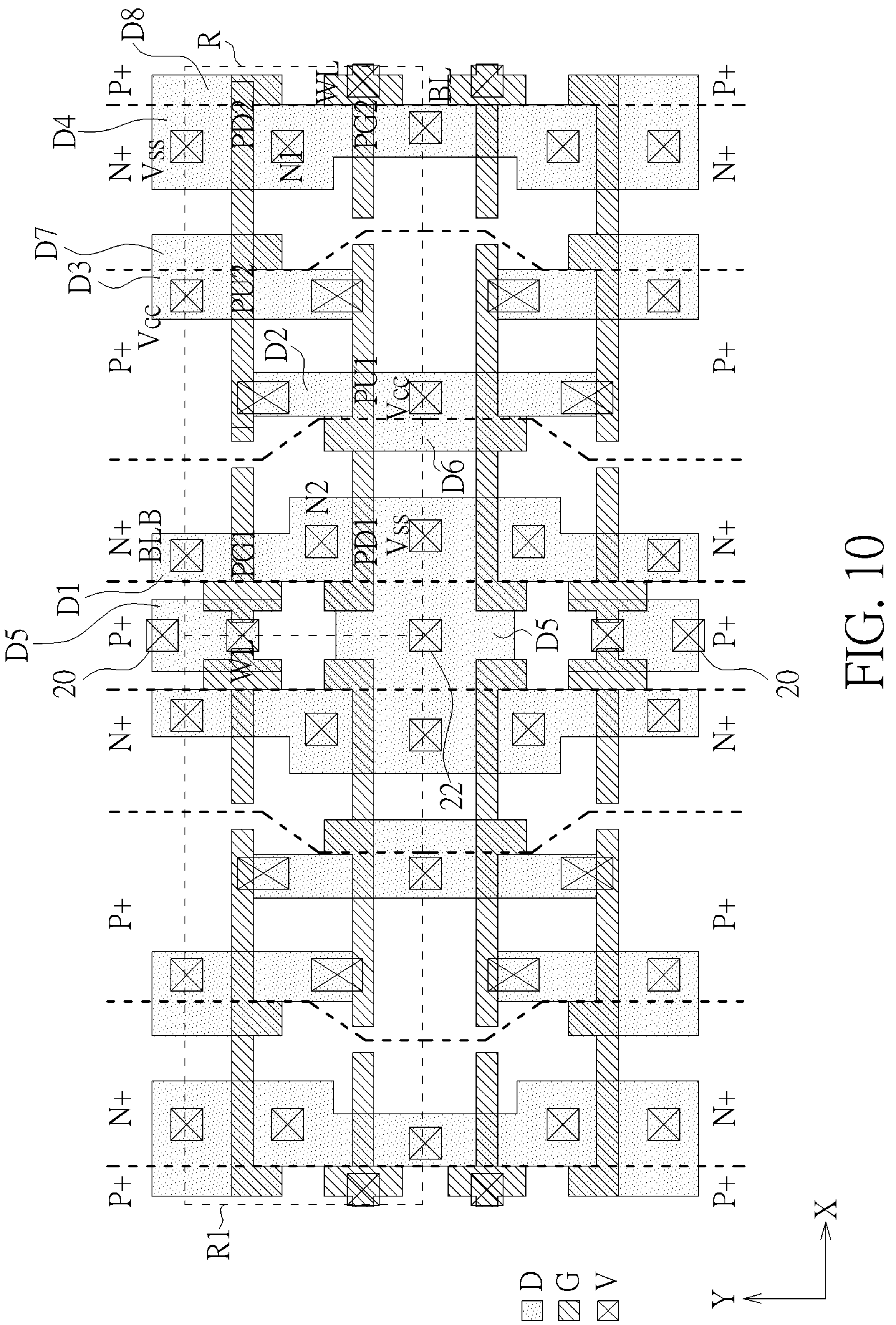
FIG. 10 is a layout diagram of a static random access memory (SRAM) cell according to a fifth preferred embodiment of the present invention.

FIG. 10 is a layout diagram of a static random access memory (SRAM) cell according to a fifth preferred embodiment of the present invention. Most of the elements in this embodiment are the same as those in the fourth embodiment shown in FIG. 9, but the difference between this embodiment and the fourth embodiment is that the diffusion region D5 is divided into different regions. More specifically, the diffusion regions D5 contained in the access transistors (PG1 and PG2) and the pull-down transistors (PD1 or PD2) are not directly connected with each other, while the access transistors (PG1 and PG2) discharges charges through the body contact 20, and the pull-down transistor (PD1 or PD2) discharges the charge with the body contact 22 or Vss contact structure. This layout is also within the scope of the present invention.

Figure 11:
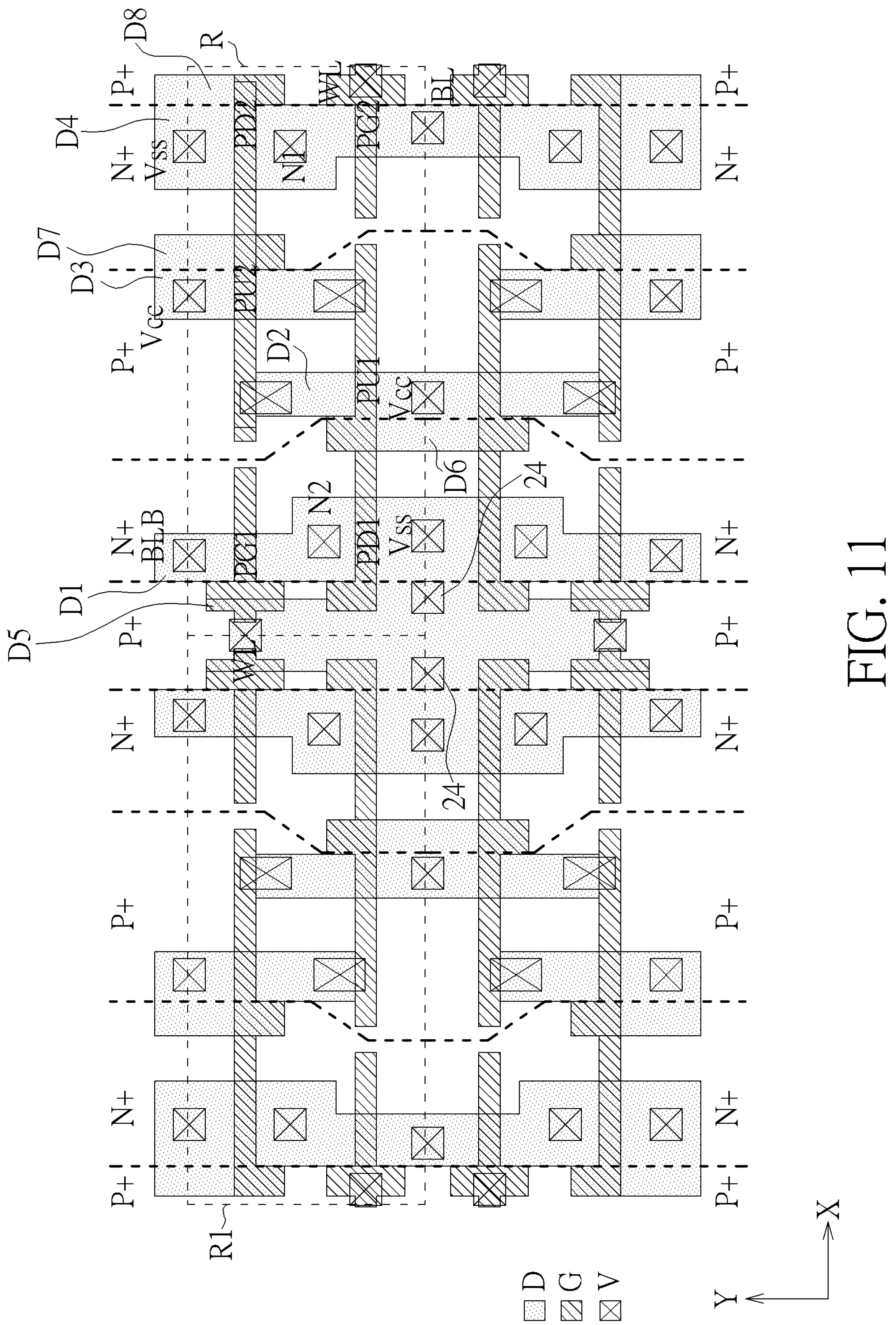
FIG. 11 is a layout diagram of a static random access memory (SRAM) cell according to a sixth preferred embodiment of the present invention.

FIG. 11 is a layout diagram of a static random access memory (SRAM) cell according to a sixth preferred embodiment of the present invention. Most of the elements in this embodiment are the same as those in the fourth embodiment shown in FIG. 9, but the difference between this embodiment and the fourth embodiment is that a body contact 24 is added, which is located at the junction of the diffusion region D1 and the diffusion region D5, and this embodiment omits the body contact 20 and reduces the diffusion region D5 nearby. That is to say, the access transistors (PG1 and PG2) and the pull-down transistors (PD1 or PD2) in this embodiment can share the body contact 24 or the Vss contact structure (used as the body contact) to release the charges. This layout is also within the scope of the present invention.

Based on the above description and drawings, the present invention provides a layout pattern of static random-access memory (SRAM), which includes a substrate 12, and a plurality of diffusion regions D1-D8 are located on the substrate, each diffusion region including a first diffusion region D1, a second diffusion region D2, a third diffusion region D3, a fourth diffusion region D4, a fifth diffusion region D5, a sixth diffusion region D6, a seventh diffusion region D7 and an eighth diffusion region D8. A plurality of gate structures G are located on the substrate 12, and each gate structure G extends along a second direction (the X direction) and spans a plurality of diffusion regions D1-D8 to form a plurality of transistors. The plurality of transistors comprise a first pull-up transistor (PU1), a first pull-down transistor (PD1), a second pull-up transistor (PU2), a second pull-down transistor (PD2), a first access transistor (PG1) and a second access transistor (PG2), the plurality of gate structures comprise a first gate structure G1, the first gate structure G1 comprises a first L-shaped portion P1. The first L-shaped portion P1 spans the first diffusion region D1 and the fifth diffusion region D5 and forms a first pull-down transistor (PD1), wherein the first diffusion region D1 is adjacent to and in direct contact with the fifth diffusion region D5 (for example, the embodiment shown in FIG. 5).

In some embodiments of the present invention, the first L-shaped portion P1 includes a short side portion P1B and a long side portion P1A, wherein the short side portion P1B of the first L-shaped portion P1 is arranged along a first direction (the Y direction) and the long side portion PIA of the first L-shaped portion P1 is arranged along a second direction (the X direction).

In some embodiments of the present invention, the short side portion P1B of the first L-shaped portion P1 is located on the fifth diffusion region D5, and the long side portion P1A of the first L-shaped portion P1 is located on the first diffusion region D1.

In some embodiments of the present invention, the first gate structure G1 includes a second L-shaped portion P2, which spans the second diffusion region D2 and the sixth diffusion region D6 to form the first pull-up transistor (PU1), wherein the second diffusion region D2 is adjacent to and directly contacts the sixth diffusion region D6 (for example, the embodiment shown in FIG. 4).

In some embodiments of the present invention, the second L-shaped portion P2 includes a short side portion P2B and a long side portion P2A, wherein the short side portion P2B of the second L-shaped portion P2 is arranged along a first direction (Y direction) and the long side portion P2A of the second L-shaped portion P2 is arranged along a second direction (X direction).

In some embodiments of the present invention, the long side portion P1A of the first L-shaped portion P1 and the long side portion P2A of the second L-shaped portion P2 are aligned with each other in the second direction (X direction).

In some embodiments of the present invention, the short side portion P2B of the second L-shaped portion P2 is located on the sixth diffusion region D6, and the long side portion P2A of the second L-shaped portion P2 is located on the second diffusion region D2.

In some embodiments of the present invention, the plurality of gate structures G includes a second gate structure G2, which spans the first diffusion region D1 and the fifth diffusion region D5 and forms the first access transistor (PG1), wherein, from a top view, the second gate structure G2 has a T-shaped profile (for example, the embodiment shown in FIG. 6).

In some embodiments of the present invention, the second gate structure G2 has a short side portion G2B and a long side portion G2A, wherein the short side portion G2B of the second gate structure G2 is arranged along the first direction (the Y direction) and the long side portion G2A of the second gate structure G2 is arranged along the second direction (the X direction).

In some embodiments of the present invention, the short side portion G2B of the second gate structure G2 is located on the fifth diffusion region D5, and the long side portion G2A of the second gate structure G2 is located on the first diffusion region D1.

In some embodiments of the present invention, a body contact 20 is further included, which is located on the fifth diffusion region D5 and electrically connected with the fifth diffusion region D5.

In some embodiments of the present invention, the first diffusion region D1, the fourth diffusion region D4, the sixth diffusion region D6 and the seventh diffusion region D7 contain a first conductivity type (for example, N type), and the second diffusion region D2, the third diffusion region D3, the fifth diffusion region D5 and the eighth diffusion region D8 contain a second conductivity type (for example, P type).

In some embodiments of the present invention, the first conductivity type (e.g., N type) is different from the second conductivity type (e.g., P type).

In some embodiments of the present invention, the substrate 12 comprises an SOI substrate.

In some embodiments of the present invention, it further includes a third gate structure G3, which spans the third diffusion region D3 and the seventh diffusion region D7 and forms a second pull-up transistor (PU2), wherein the third diffusion region D3 is adjacent to and in direct contact with the seventh diffusion region D7.

In some embodiments of the present invention, the third gate structure G3 spans the fourth diffusion region D4 and the eighth diffusion region D8 and forms a second pull-down transistor (PD2), wherein the fourth diffusion region D4 is adjacent to and in direct contact with the eighth diffusion region D8.

In some embodiments of the present invention, the first gate structure G1 and the third gate structure G3 are symmetrical to each other along a central point O.

In some embodiments of the present invention, the plurality of gate structures includes a fourth gate structure G4, which spans the fourth diffusion region D4 and the eighth diffusion region D8 and forms the second access transistor (PG2), wherein the fourth gate structure G4 has a T-shaped profile when viewed from a top view.

In some embodiments of the present invention, the second gate structure G2 and the fourth gate structure G4 are symmetrical to each other along a central point O.

In some embodiments of the present invention, the layout pattern of the SRAM is arranged adjacent to the layout pattern of another SRAM (for example, in the region R and the region R1 respectively), and the fifth diffusion region D5 of the layout pattern of the SRAM is in direct contact with an eighth diffusion region D8 of the layout pattern of the another SRAM.

The invention is characterized in that an improved layout pattern of static random access memory is proposed, in which some additional diffusion regions are located next to the original diffusion regions, the additional diffusion regions have the opposite conductivity type to the original diffusion regions, and the gate structures are designed to be L-shaped or T-shaped (from the top view). In this way, the charges accumulated under the gate structure can flow out through the diffusion region, and then the charges is released through the contact structure, so as to avoid affecting the electrical properties of the transistor and improve the product yield.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A layout pattern of a static random-access memory (SRAM), comprising:

a substrate;

a plurality of diffusion regions located on the substrate, and the plurality of diffusion regions comprise a first diffusion region, a second diffusion region, a third diffusion region, a fourth diffusion region, a fifth diffusion region, a sixth diffusion region, a seventh diffusion region and an eighth diffusion region, and the plurality of diffusion regions are arranged along a first direction (Y direction);

a plurality of gate structures located on the substrate, and each gate structure extends along a second direction (X direction) and crosses the diffusion regions to form a plurality of transistors, wherein the plurality of transistors comprise a first pull-up transistor (PU1), a first pull-down transistor (PD1), a second pull-up transistor (PU2), a second pull-down transistor (PD2), a first access transistor (PG1) and a second access transistor (PG2);

wherein the plurality of gate structures comprise a first gate structure, wherein the first gate structure comprises a first L-shaped portion which spans the first diffusion region and the fifth diffusion region to form the first pull-down transistor (PD1), wherein the first diffusion region is adjacent to and in direct contact with the fifth diffusion region.

2. The layout pattern of SRAM according to claim 1, wherein the first L-shaped portion comprises a short side portion and a long side portion, wherein the short side portion of the first L-shaped portion is arranged along the first direction (Y direction) and the long side portion of the first L-shaped portion is arranged along the second direction (X direction).

3. The layout pattern of SRAM according to claim 2, wherein the short side portion of the first L-shaped portion is located on the fifth diffusion region, and the long side portion of the first L-shaped portion is located on the first diffusion region.

4. The layout pattern of SRAM according to claim 2, wherein the first gate structure comprises a second L-shaped portion which spans the second diffusion region and the sixth diffusion region and constitutes the first pull-up transistor (PU1), wherein the second diffusion region is adjacent to and in direct contact with the sixth diffusion region.

5. The layout pattern of SRAM according to claim 4, wherein the second L-shaped portion comprises a short side portion and a long side portion, wherein the short side portion of the second L-shaped portion is arranged along the first direction (Y direction) and the long side portion of the second L-shaped portion is arranged along the second direction (X direction).

6. The layout pattern of SRAM according to claim 5, wherein the long side portion of the first L-shaped portion and the long side portion of the second L-shaped portion are aligned with each other in the second direction (X direction).

7. The layout pattern of SRAM according to claim 4, wherein the short side portion of the second L-shaped portion is located on the sixth diffusion region and the long side portion of the second L-shaped portion is located on the second diffusion region.

8. The layout pattern of SRAM according to claim 4, wherein the plurality of gate structures include a second gate structure which spans the first diffusion region and the fifth diffusion region and constitutes the first access transistor (PG1), wherein the second gate structure has a T-shaped profile when viewed from a top view.

9. The layout pattern of SRAM according to claim 8, wherein the second gate structure has a short side portion and a long side portion, wherein the short side portion of the second gate structure is arranged along the first direction (Y direction) and the long side portion of the second gate structure is arranged along the second direction (X direction).

10. The layout pattern of SRAM according to claim 9, wherein the short side portion of the second gate structure is located on the fifth diffusion region and the long side portion of the second gate structure is located on the first diffusion region.

11. The layout pattern of SRAM according to claim 8, further comprising a body contact located on the fifth diffusion region and electrically connected with the fifth diffusion region.

12. The layout pattern of the SRAM according to claim 1, wherein the first diffusion region, the fourth diffusion region, the sixth diffusion region and the seventh diffusion region comprise a first conductivity type, and the second diffusion region, the third diffusion region, the fifth diffusion region and the eighth diffusion region comprise a second conductivity type.

13. The layout pattern of SRAM according to claim 12, wherein the first conductivity type is different from the second conductivity type.

14. The layout pattern of the SRAM according to claim 1, wherein the substrate comprises an SOI substrate.

15. The layout pattern of SRAM according to claim 1, further comprising a third gate structure, which spans the third diffusion region and the seventh diffusion region and forms the second pull-up transistor (PU2), wherein the third diffusion region is adjacent to and in direct contact with the seventh diffusion region.

16. The layout pattern of SRAM according to claim 15, wherein the third gate structure spans the fourth diffusion region and the eighth diffusion region and forms the second pull-down transistor (PD2), wherein the fourth diffusion region is adjacent to and in direct contact with the eighth diffusion region.

17. The layout pattern of SRAM according to claim 16, wherein the first gate structure and the third gate structure are symmetrical to each other along a central point.

18. The layout pattern of SRAM according to claim 1, wherein the plurality of gate structures include a second gate structure and a fourth gate structure, and the fourth gate structure spans the fourth diffusion region and the eighth diffusion region to form the second access transistor (PG2), wherein the fourth gate structure has a T-shaped profile when viewed from a top view.

19. The layout pattern of SRAM according to claim 18, wherein the second gate structure and the fourth gate structure are symmetrical to each other along a central point.

20. The layout pattern of the SRAM according to claim 1, wherein the layout pattern of the SRAM is arranged adjacent to a layout pattern of another SRAM, and the fifth diffusion region of the layout pattern of the SRAM is in direct contact with an eighth diffusion region of the layout pattern of the another SRAM.

* * * * *